United States Patent [19]
Broadbent

[11] Patent Number: 4,602,314
[45] Date of Patent: Jul. 22, 1986

[54] HEAT CONDUCTION MECHANISM FOR SEMICONDUCTOR DEVICES

[75] Inventor: Neal E. Broadbent, Beaverton, Oreg.
[73] Assignee: Intel Corporation, Santa Clara, Calif.
[21] Appl. No.: 541,961
[22] Filed: Oct. 14, 1983
[51] Int. Cl.[4] .............................................. H05K 7/20
[52] U.S. Cl. .................................... 361/386; 165/185; 357/81; 174/16 HS
[58] Field of Search ..................... 174/16 HS; 357/81; 165/80 B, 80 A, 80 D, 185; 361/382, 383, 385–389

[56] References Cited

U.S. PATENT DOCUMENTS

| | | | |
|---|---|---|---|
| 3,825,803 | 7/1974 | Budde | 357/81 |
| 4,092,697 | 5/1978 | Spaight | 361/386 |
| 4,093,971 | 6/1978 | Chu | 357/81 |
| 4,190,098 | 2/1980 | Hanlon | 361/383 |
| 4,246,597 | 1/1981 | Cole | 357/81 |
| 4,251,852 | 2/1981 | Ecker | 361/386 |
| 4,471,837 | 9/1984 | Larson | 165/185 |

OTHER PUBLICATIONS

IBM Tech. Discl. Bull., vol. 14, No. 11, Apr. 1972, pp. 3332, "Replaceable Chip . . . Boards", Dunkel.
IBM Tech. Discl. Bull., vol. 20, No. 7, Dec. 1977, pp. 2697, "Air-Cooled . . . Configurations", Metreaud.

Primary Examiner—G. P. Tolin
Attorney, Agent, or Firm—Blakely, Sokoloff, Taylor & Zafman

[57] ABSTRACT

The present invention provides a mechanism for conducting heat away from a semiconductor device, and has particular application for use with VLSI technology. The present invention comprises an elongated, resilient and deformable central body having a thermally conductive outer surface which is disposed in contact with a surface of the semiconductor device. In the preferred embodiment, the semiconductor devices comprising an electronic circuit configuration are disposed on a circuit board in rows. The present invention is formed into strips such that one strip of the central body portion of the present invention is disposed over each row of semiconductor devices. A heat sink is placed over the central body portion of the present invention such that the central body with its thermally conductive outer surface is sandwiched between an upper surface of the semiconductor device and the heat sink. Heat generated by the semiconductor device is conducted through the thermally conductive outer surface of the resilient central body to the heat sink where it is radiated and conducted away from the semiconductor device.

6 Claims, 2 Drawing Figures

HEAT CONDUCTION MECHANISM FOR SEMICONDUCTOR DEVICES

BACKGROUND OF THE INVENTION

1. Field of the Invention

The present invention relates to mechanisms for conducting heat away from a semiconductor device, and more particularly, to mechanisms for conducting heat away from a multiplicity of densely packed, solid state components coupled to a printed circuit board.

2. Art Background

During the course of evolution of solid state technology, increasing amounts of circuitry have been packed into single large scale integrated packages in order to conserve space, reduce cost and to enlarge the capability of electronic systems. Although the increase in density within a semiconductor component package greatly conserves space and provides a lower cost, such packaging generally increases the heat generated by each semiconductor device and their associated solid state components within a given circuit. The advent of very large scale integration (VLSI) requires that methods be utilized in order to effectively cool circuit structures utilizing a multiplicity of VLSI semiconductor devices in order to preclude premature failure of one or more components.

A number of devices for cooling solid state components attached to a printed circuit board have been proposed (see for example U.S. Pat. Nos. 4,190,098, 3,825,803, 4,093,971, and 4,246,597). However, a major disadvantage of existing cooling devices for semiconductor devices is that typically various species of solid state components are coupled to a single circuit board. Many of the semiconductor packages (typically dual in-line packages or "DIPs") have varying heights above the circuit board base. As such, it has been found that existing devices historically used to cool solid state components are not directly applicable and must be modified for each particular printed circuit board which is populated by different devices.

As will be disclosed, the present invention overcomes the disadvantages associated with prior art heat dissipating devices for semiconductor circuits, and permits solid state devices having varying heights to be cooled using the same heat conduction mechanism on a printed circuit board.

SUMMARY OF THE INVENTION

The present invention provides a mechanism for conducting heat away from a semiconductor device, and has particular application for use with VLSI technology. The present invention comprises an elongated, resilient and deformable central body having a thermally conductive and deformable outer surface which is disposed in contact with a surface of the semiconductor device. In the preferred embodiment, the semiconductor devices comprising an electronic circuit configuration are disposed on a circuit board in rows. The present invention is formed into strips such that one strip of the central body portion of the present invention is disposed over each row of semiconductor devices. A heat sink is placed over the central body portion of the present invention such that the central body with its thermally conductive outer surface is sandwiched between an upper surface of the semiconductor device and the heat sink. Heat generated by the semiconductor device is conducted through the thermally conductive outer surface of the resilient central body to the heat sink where it is radiated and conducted away from the semiconductor device.

DETAILED DESCRIPTION

A heat conducting mechanism is disclosed having particular application for use in conjunction with semiconductor devices. In the following description, numerous details are set forth such as specific materials, shapes, and structures, etc. in order to provide a thorough understanding of the present invention. However, it will be apparent to one skilled in the art that the present invention may be practiced without these specific details. In other instances, well known circuit, packages and the like are shown in diagramatical form in order not to obscure the present invention unnecessarily.

Figure 1:
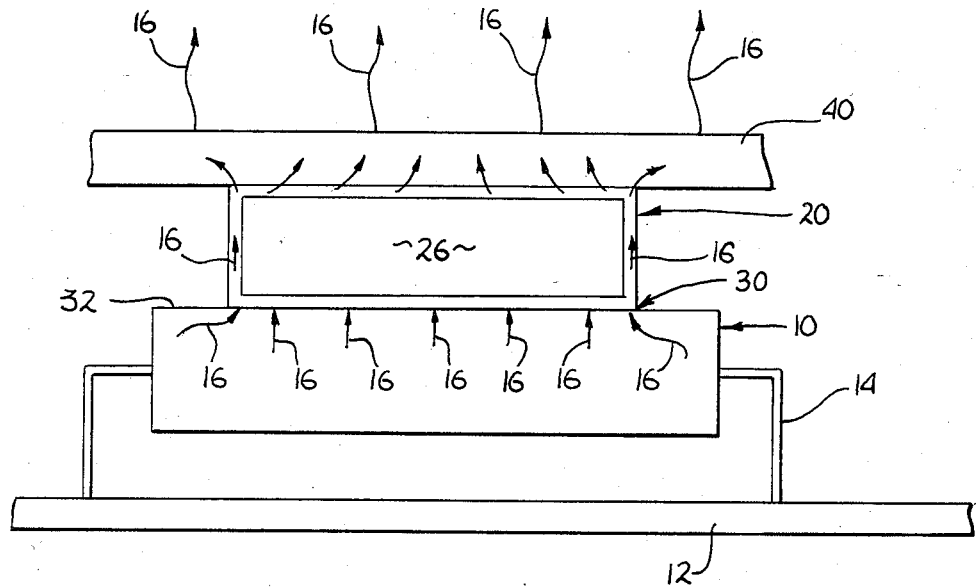
FIG. 1 is a side, partial sectional view of the heat conductive mechanism of the present invention.

Referring to FIG. 1, in a typical application, a semiconductor device (hereinafter a "chip") 10 is electrically coupled to a printed circuit board 12 by leads 14. As is well known, the electrical operation chip 10 generates heat denoted generally by arrows 16, which if not properly conducted away from chip 10 may cause premature failure of the solid state component. Heat conduction mechanism 20 includes a flexible and resilient central core 26 having a thermally conductive and deformable metallic outer surface 30 surrounding the resilient central core 26.

As illustrated, heat conductive mechanism 20 is disposed over the upper surface 32 of chip 10 such that a portion of the conductive outer surface 30 is in physical contact with surface 32 of the chip. A heat sink 40 is disposed in physical contact with the upper surface of the heat conductive mechanism 20 such that heat 16 generated by chip 10 is conducted by the thermally conductive outer surface 30 away from the chip 10 and to heat sink 40, where it is radiated and conducted safely into the ambient environment.

In the present embodiment, it has been found that the thermally conductive outer surface 30 may comprise a thin layer aluminum or copper, however, other similar thermally conductive materials may be used depending upon the environment in which the present invention is to be utilized. Moreover, although FIG. 1 illustrates the use of a heat sink 40 disposed in physical contact with heat conductive mechanism 20 in order to dissipate thermal energy associated with the chip 10, it will be appreciated by one skilled in the art that heat sink 40 is not required or desirable in all cases depending on the particular application. For instance, in a relatively cold environment the placement of the present invention in contact with chip 10 may provide sufficient cooling by conducting heat 16 away from the chip 10 and radiating and conducting heat 16 away from the chip through the thermally conductive outer surface 30 of the present invention. In addition, it has been found that the resilient central body 26 of the present invention may comprise virtually any elastomeric material, such as by way of illustration and not limitation, foam, rubber, neoprene, plastic or the like.

Figure 2:
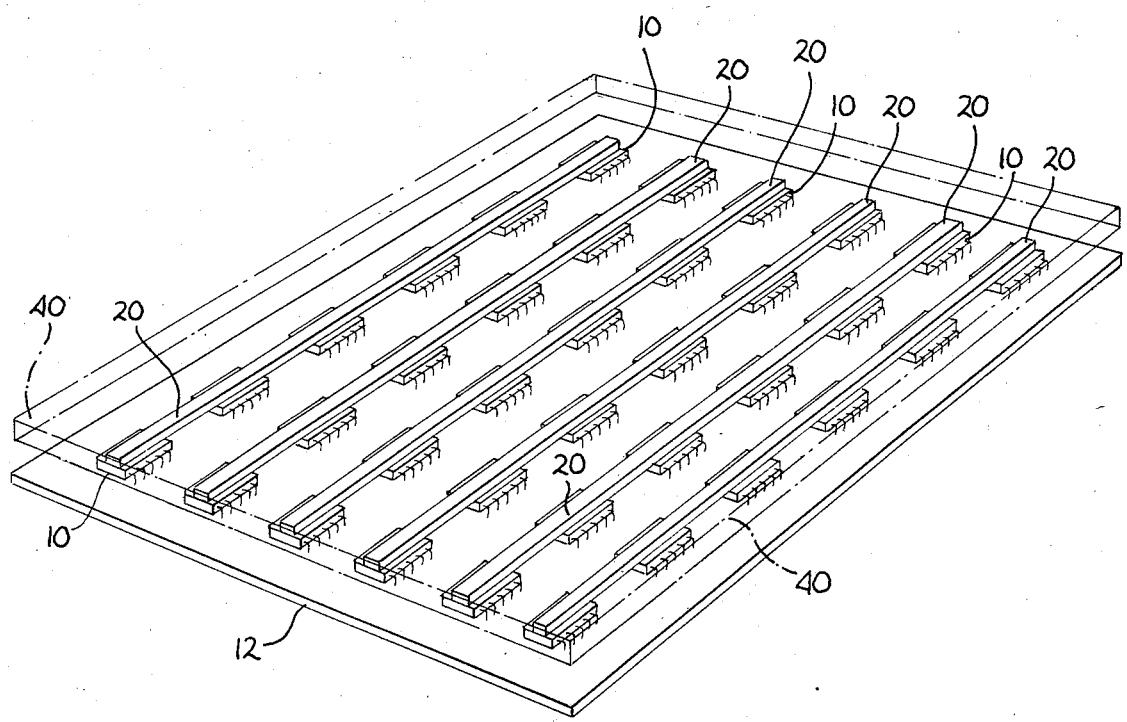
FIG. 2 is a perspective view illustrating the use of the present invention in conjunction with a multiplicity of semiconductor devices on a printed circuit board.

Referring now to FIG. 2, the preferred embodiment of the present invention is illustrated. As shown, circuit board 12 includes a multiplicity of chips 10 disposed in rows on circuit board 12. The heat conduction mechanism 20 comprising the present invention is formed such that the elongated central body portion 26 comprises a strip of foam material surrounded by the thermally conductive and deformable outer surface 30, and is placed such that the heat conduction mechanism 20 overlays a row of chips 10, as best illustrated in FIG. 2. Heat sink 40, which may comprise a panel or other metallic surface within an electronic housing or the like, is disposed above and in contact with the heat conduction mechanism 20 as illustrated by phantom lines within FIG. 2. Accordingly, the heat conduction mechanisms 20 are effectively sandwiched between the heat sink 40 and the rows of chips 10 disposed on circuit board 12, such that heat generated by chips 10 is conducted through the conductive outer surface 30 away from each chip 10 and to the heat sink 40 for radiation and conduction into the ambient environment.

It will be appreciated, that the present invention may be used in applications where in the chips 10 coupled to the printed circuit board 12 have varying heights, inasmuch as central body 26 is comprised of a resilient and deformable material. The resilient and deformable nature of the central body 26 and outer surface 30 insures that the heat conduction mechanism 20 maintains maximum surface contact with each chip 10 and thereby maximizes heat conductivity away from the semiconductor device toward the heat sink 40. In addition, it will be noted that the forming of the present invention's heat conducting mechanism 20 into strips to overlay a multiplicity of chips 10 tends to equalize the temperature of each solid state device within the row by thermally coupling each chip along a particular row in which the present invention is used.

Although the present invention has been illustrated and described as having a generally rectangular shape, it will be apparent to one skilled in the art that central body 26 may be formed into a variety of configurations depending on the shape of the particular semiconductor device to be cooled. Similarly, while the preferred embodiment of the present invention has been described specifically for purposes of illustration, it will be readily apparent that numerous modifications and variations may be made which do not constitute departures from the true spirit and scope of the present invention.

I claim:

1. A device which conducts heat away from a plurality of integrated circuit packages mounted on a printed circuit board, comprising:
   a resilient and deformable central body, said central body being generally formed into a contiguous strip;
   a thermally conductive deformable outer member substantially surrounding said central body, said inner central body comprises a thermally nonconducting elastomer;
   said central body being disposed such that a portion of said outer member physically contacts a plurality of said integrated circuit packages on said printed circuit board, to conduct heat generated by said packages through said outer member and radiated away from said integrated circuit packages.

2. The device as defined by claim 1, further including a metallic heat sink in contact with said outer member, opposite said surface in contact with said packages, such that heat is conducted through said outer member to said heat sink and into the ambient environment.

3. The device as defined by claim 2, wherein said integrated circuit packages are mounted on said printed circuit board in a row.

4. The device as defined by claim 1, wherein said thermally conductive deformable outer member comprises aluminum.

5. The device as defined by claim 1, wherein said thermally conductive deformable outer member comprises copper.

6. A mechanism dissipating heat from a plurality of integrated circuit packages mounted on a printed circuit board, comprising:
   a plurality of resilient and deformable central bodies, each of said central bodies being formed into a contiguous strip;
   a thermally conductive deformable metallic outer member substantially surrounding each of said central bodies said inner central body comprises a thermally non-conducting elastomer;
   each of said central bodies being disposed such that each of said outer members are in physical contact with a plurality of said integrated circuit packages on said printed circuit board;
   a metallic heat sink disposed above said plurality of central bodies and in physical contact with each of their outer members, such that heat eminating from said packages is conducted through said outer members and to said heat sink and radiated to the ambient environment.

* * * * *